United States Patent [19]
Wada et al.

[11] 4,371,967
[45] Feb. 1, 1983

[54] SEMICONDUCTOR LASER

[75] Inventors: Masaru Wada, Takatsuki; Hirokazu Shimizu, Toyonaka; Takashi Sugino, Takatsuki; Kunio Itoh, Uji, all of Japan

[73] Assignee: Matsushita Electric Industrial Co., Ltd., Kadoma, Japan

[21] Appl. No.: 215,665

[22] Filed: Dec. 12, 1980

[30] Foreign Application Priority Data

Dec. 19, 1979 [JP] Japan ............................... 54-165878

[51] Int. Cl.³ ............................................... H01S 3/19
[52] U.S. Cl. ....................................... 372/45; 357/17; 357/63
[58] Field of Search ..................... 372/45, 46; 357/16, 357/17, 63

[56] References Cited
PUBLICATIONS

Kessler, "A Laser That May Change Communications", *Electronic Design*, vol. 20, Sep. 27, 1970, p. 31.
Yonezu et al., "A GaAs-Al$_x$Ga$_{1-x}$As Double Heterostructure Panar Stripe Laser", Japan, *J. Appl. Phys.*, vol. 12, pp. 1585-1592, Oct. 1973.

*Primary Examiner*—James W. Davie
*Attorney, Agent, or Firm*—Cushman, Darby & Cushman

[57] ABSTRACT

In a semiconductor laser which has epitaxial layers including an active layer on a semiconductor substrate, a buffer layer is formed neighboring the active layer, in order to prevent undesirable diffusion of a highly diffusing dopant (Zn) into the active layer from an adjacent layer such as the second clad layer. The buffer layer has the same conductivity as that of the adjacent layer, has a broader energy gap than the active layer, and the dopant of the buffer layer is less diffusing than that of the adjacent layer.

6 Claims, 6 Drawing Figures

SEMICONDUCTOR LASER

BACKGROUND OF THE INVENTION

1. Field of the Invention

The present invention relates to an improvement in a semiconductor laser. The improvement is for obtaining a laser with a higher yield.

2. Description of the Prior Art

In developments of the semiconductor laser, for example, (GaAl)As lasers are now actively being made, and such a long lifetime as $10^5$ to $10^6$ hours have been already actually achieved for (GaAl)As lasers for 0.8 $\mu$m (wave length range).

For use in video disk players and laser printers, or the like information processing apparatus, now visible light lasers of (GaAl)As or Ga(AsP) or GaInAsP which oscillate in 0.7 $\mu$m (wave length range) are now actively developed, and especially the (GaAl)As visible light laser is now in the stage of practical use.

Reported minimum wavelength of the (GaAl)As is about 710 nm, and for the one of shorter wavelength the lifetime of the laser becomes very much short. One of the supposed reasons for such short lifetime is undesirable diffusions of impurity in the p-type clad layer into the active layer during the epitaxial growth step in the manufacture or in the operation of the laser, as well as, resultant forming of in non-uniform carrier distribution in the active layer and also consequent forming of dark spots and dark lines to form defects therein. Therefore, it is desirable to adopt such an impurity for the clad layers that is not likely to diffuse into the active layer. The impurities Sn and Ge respectively as donor and acceptor for clad layers of the (GaAl)As infrared laser has desirably small vapor pressures and also has desirably low diffusion thereof into neighboring layer and hence are usable to obtain concentration of $5 \times 10^{17} cm^{-3}$ for such infrared laser, and therefore Sn and Ge have been used in the infrared laser. However, impurities Sn and Ge are not suitable for the visible light (GaAl)As laser, since in the p-type and n-type layer the attainable highest impurity concentration with these impurities is only $10^{16} cm^{-3}$ when the Al fraction $x \times 0.6 - 0.7$ in the clad layers, and therefore the clad layers become of high resistivity, and hence poor yield of production.

Because of the abovementioned reason, Te and Zn are used for the donor and acceptor for the clad layers of the visible light (GaAl)As lasers and its doping amount is adjusted so as to obtain $5 \times 10^{17} cm^{-3}$. However, such conventional (GaAl)As visible light laser has had the problem that an extraordinarily careful controlling is required in the epitaxial growth process for manufacturing with a high yield in order to prevent undesirable diffusion of such impurities from the clad layers into the neighboring active layer due to the high vapor pressure of Te or Zn, resulting in high cost of manufacture.

One typical example of the abovementioned visible light (GaAl)As laser is elucidated referring to FIG. 1, wherein by means of known liquid phase epitaxial growth method, on

| a substrate 1 | of n-GaAs |
|---|---|
| the following layers are sequentially formed: | |
| a first clad layer 2 | of Te—doped n-Ga$_{1-x}$Al$_x$As (2-3 $\mu$m thick), |
| an active layer 3 | of non-doped Ga$_{1-p}$Al$_p$As (about 0.1 $\mu$m thick), |
| a second clad layer 4 | of Zn—doped p-Ga$_{1-x}$Al$_x$As (about 1.5 $\mu$m thick), and |
| a cap layer 5 | of Ge— or Zn—doped p$^+$-GaAs (0.5 $\mu$m thick). |

Thereafter, electrodes 8 and 9 are formed.

The Al fractions $x$ and $y$ are selected to be $x = 0.3 - 0.85$ and $y = 0 - 0.25$ for oscillation of the wavelength of 9000 to 7000 Å.

In the conventional laser shown in FIG. 1, the p-type clad layer 4 contacts the active layer 3 with all the area thereof, and therefore, the impurity Zn in the clad layer 4 considerably diffuses into the active layer, and accordingly the characteristic and lifetime of the laser is influenced by the diffusion. That is, as a result of the Zn-diffusion into the active layer, the highest usable temperature becomes lower and the current-light output curve is likely to produce a kink as shown in FIG. 2, and the lifetime becomes 1/5 times as that of the laser having Ge-doped clad layers.

SUMMARY OF THE INVENTION

The present invention provides improved semiconductor lasers having longer lifetime and improved characteristics by adopting an improved structure. According to the present invention, use of Zn as impurity in the clad layer results in nothing adverse to the lifetime and characteristics. Therefore, by adoption of Zn as the impurity, ease of manufacturing is achieved together with the long lifetime and the good input current-light output characteristic.

DESCRIPTION OF THE PREFERRED EMBODIMENTS

A semiconductor laser in accordance with the present invention comprises a semiconductor substrate and epitaxial layers including an active layer and formed thereon, wherein at least one part of said semiconductor layers which neighbors said active layer is a composite layer comprising two component layers of the same conductivity type and of different dopants from each other, and both of said two component layers have a broader energy gap than that of said active layer.

The invention is elucidated hereinafter referring to FIG. 3 to FIG. 6 which show preferred embodiments of the present invention.

Figure 3:
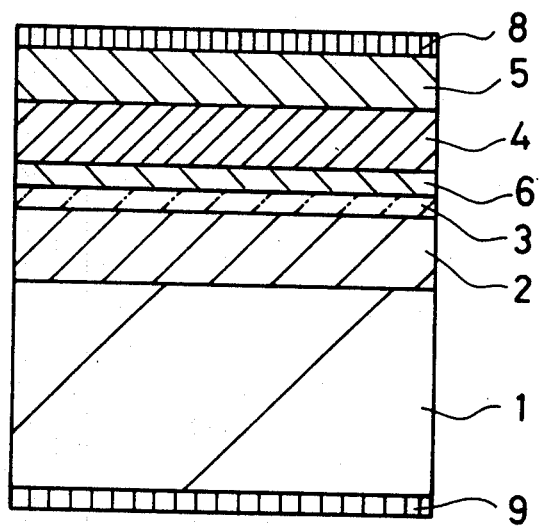
FIG. 3 is a sectional elevation view of an example of a semiconductor laser embodying the present invention.

FIG. 3 is a sectional elevation view of a first example of a semiconductor laser in accordance with the present invention. The laser is made by a known liquid phase epitaxial growth method as follows:

| On a substrate 1 | of n-GaAs |
|---|---|
| the following layers are sequentially formed: | |
| a first clad layer 2 | of Te—doped n-$Ga_{1-x}Al_xAs$ (2–3 μm thick), |
| an active layer 3 | of non-doped $Ga_{1-y}Al_yAs$ (about 0.1 μm thick), |
| a buffer layer 6 | of Ge—doped p-$Ga_{1-z}Al_zAs$ 0-1–0.5 μm thick), |
| a second clad layer 4 | of Zn—doped p-$Ga_{1-x}Al_xAs$ (about 1.5 μm thick), and |
| a cap layer 5 | of Ge— or Zn—doped $p^+$-GaAs (0.5 μm thick). |

After further diffusion of Zn on the surface part of the cap layer, the electrodes 8 and 9 are formed.

The Al fractions y is selected to be smaller than x and z, and accordingly the energy gap of the buffer layer 6 becomes broader than that of the active layer 3. The fraction z of Al of the buffer layer 6 is selected to be equal to or smaller than that of the clad layer 4. The thickness of the buffer layer 6 should be selected thinner than 0.5 μm in order to avoid undue high resistance across the layer 6 since the resistivity of the layer 6 is likely to become high due to the Ge-doping when its Al fraction is large. However on the other hand, the thickness should be more than 0.1 μm in order to perform a function as a buffer against the diffusion of Zn from the p-type clad layer 4 into the active layer 3.

Figure 5:
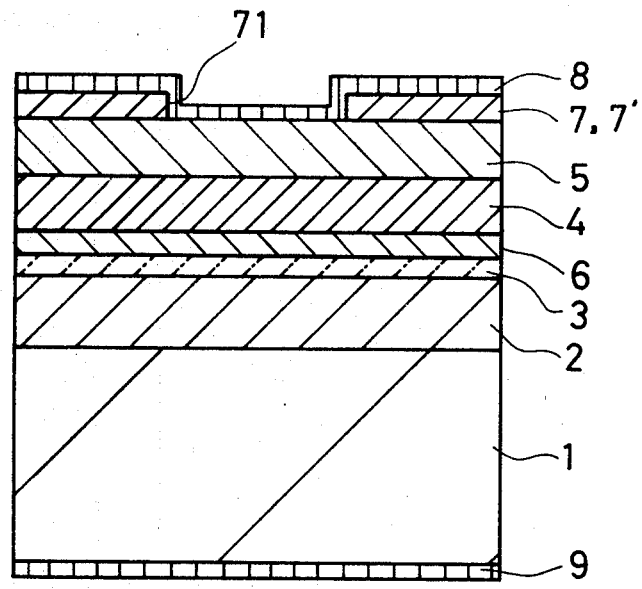
FIGS. 5 and 6 are sectional elevation views of other examples of a semiconductor laser embodying the present invention.

In case of making a stripe shaped structure by means of a heteroisolation as shown by FIG. 5, a semiconductor heteroisolation layer 7 of opposite conductivity type to the cap layer 5, that is for example an n-$Ga_{0.5}Al_{0.5}As$ layer 7 is also formed by the sequential epitaxial growth. In case of making a stripe shaped structure by means of an insulation film 7' such as $SiO_2$ or $Si_3N_4$, such insulation film 7' is provided on the p-GaAs layer 5 by a CVD or sputtering method.

Then, by means of known photo-etching technology a stripe shaped opening 71 of 5–10 μm width is formed on the heteroisolation layer 7 or the insulation film 7' as shown in FIG. 5. Then, Zn as impurity to improve ohmic contact to an overriding electrode is diffused through the opening 71 into the surface part of the cap layer 5, thereby forming $p^+$- type part at the surface part of the cap layer 5 exposed from the opening 71. Then, a p-side electrode 8 is formed to make an ohmic contact to the cap layer 5 by a sequential sputtering of Ti and Pt followed by a vacuum deposition of Au; and an n-side electrode 9 is formed on the bottom face of the substrate 1 by a vapor deposition of Au-Ge-Ni alloy.

Figure 1:
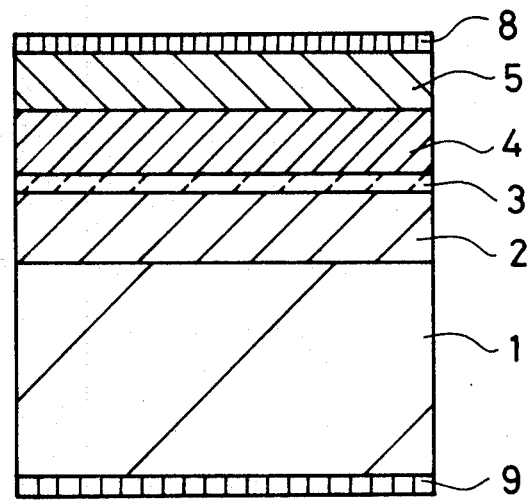
FIG. 1 is a sectional elevation view of a conventional semiconductor laser.
Figure 2:
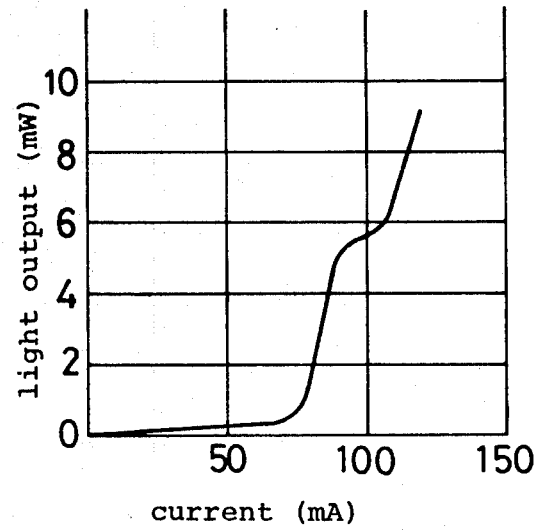
FIG. 2 is a graph showing current—light output characteristic of the conventional semiconductor laser of FIG. 1.
Figure 4:
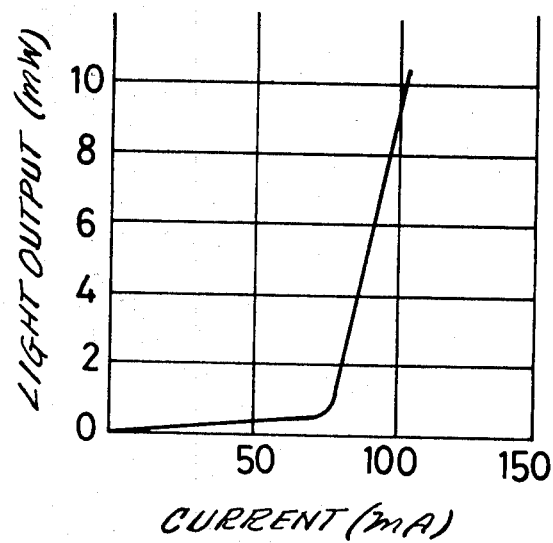
FIG. 4 is a graph showing current—light output characteristic of the conventional semiconductor laser of FIG. 2.

The laser in accordance with the present invention comprises at least a composite layer (6+4), which neighbors the active layer (3) and comprises two component layers (6+4) of the same conductivity type (p), of different dopant (Ge and Zn) from each other and having a broader energy gap than that of said active layer (3). A first component layer (6) which neighbors the active layer (3) functions as a buffer layer which protects the active layer (3) from undesirable diffusion of impurity (Zn) to active layer (3) from a second component layer (4) which neighbors the first component layer (6) at the opposite face to that contacting the active layer (3). As a result of providing the buffer layer, the current—light output curve shown in FIG. 4 does not have a kink, unlike the curve of FIG. 2 where the kink is formed by the diffusion of Zn into the active layer 3 during epitaxial growth or after long hour operations. The curves of FIG. 2 and FIG. 4 are both for the laser of wavelength of 730 nm. Furthermore, by means of the provision of the buffer layer, dark spots and dark line, which are also produced by the diffusion of Zn and give fatal effect to the lifetime, do not appear in the laser in accordance with the present invention. Thus, according to the present invention, characteristics of the linear input current—light output curve as well as a long lifetime as long as that of the infrared semiconductor laser-becomes remarkable for the semiconductor laser of visible light such as of the wavelength under 740 nm. That is to say, the lifetime of the laser in accordance with the present invention is improved by as two-figure-times as large as the lifetime of the conventional laser shown in FIG. 1 which does not have such a buffer layer. The dopant of the buffer layer 6 in the abovementioned examples has been Ge for the dopant Zn in the clad layer 4. But other dopants can be used under the condition that the two component layers of the composite layer are formed in the same conductivity type and both of the two component layers have a broader energy gap than that of the active layer.

Figure 6:
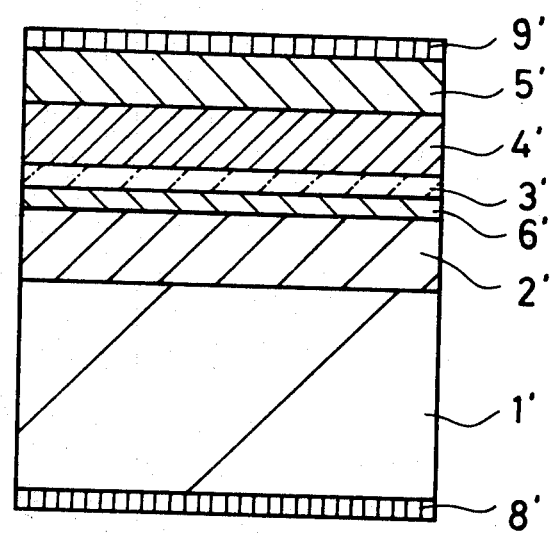

FIG. 6 shows still another example, where the substrate is a p-conductivity type GaAs. FIG. 6 shows only abstract vertical epitaxial structure of the laser, and therefore, the actual structure is such that having a stripe-shaped electrode, like the case that the laser elucidated referring to simplified FIG. 3 actually takes a structure such as those having a stripe-shaped electrode.

The laser has on

| a substrate 1' | of p-GaAs, |
|---|---|
| the following epitaxial layers: | |
| a first clad layer 2' | of Zn—doped p-$Ga_{1-x}Al_xAs$, (2–3 μm thick) |
| a buffer layer 6' | of Ge—doped p-$Ga_{1-z}Al_zAs$, (0.1–0.5 μm thick) |
| an active layer 3' | of non-doped $Ga_{1-y}Al_yAs$, (about 0.1 μm thick) |
| a second clad layer 4' | of Te—doped n-$Ga_{1-x}Al_xAs$, (about 1.5 μm thick) and |
| a cap layer 5' | of Sn—doped n-GaAs (0.5 μm thick). |

After further diffusing of S on the surface part of the cap layer 5', an n-side electrode 9' is formed by vapor deposition of Au-Ge-Ni alloy, and a p-side electrode 8' is formed by a sequential sputtering of Ti and Pt followed by a vacuum deposition of Au.

In this example, the composite layer consisting of the first clad layer 2' and the overriding buffer layer 6' is between the substrate 1' and the active layer 3'. That is to say, the buffer layer 6' is formed between the active layer 3' and the substrate 1'.

As shown by the abovementioned several examples, the buffer layer can be formed either on the upper or lower face of the active layer. But, in general, the buffer layer is more useful when provided on the opposite side of the substrate with respect to the active layer, since the adverse diffusion of Zn from a nearby layer to the active layer is very likely to occur when such layer (for example, second clad layer 4) containing Zn as dopant is being epitaxially grown after the active layer is already epitaxially grown.

What is claimed is:

1. In a semiconductor laser comprising a semiconductor substrate and epitaxial layers formed thereon including an active layer,
   at least one semiconductor layer neighboring said active layer being a composite layer comprising two component layers of a same conductivity type and doped with, for one layer in direct contact with said active layer, a dopant of a diffusion coefficient smaller than that of another dopant doped in the other layer of said two component layers, both of said two component layers having energy gaps wider than that of said active layer, and said one layer in direct contact with said active layer having an energy gap narrower than that of said the other layer of said two component layers.

2. A semiconductor laser structure in accordance with claim 1, wherein said dopant for said one of said two component layers which one is in direct contact with said active layer is Ge and said other dopant of the other of said two component layers is Zn.

3. A semiconductor laser structure in accordance with claim 1, wherein said one of said two component layers which is in direct contact with said active layer is $Ga_{1-x}Al_xAx$, and
   the other of said two component layers is $Ga_{1-z}Al_zAs$ where $X \leq Z$.

4. A semiconductor laser structure in accordance with claim 1, wherein said one of said two component layers which is in direct contact with said active layer is 0.1 to 0.5 $\mu$m thick.

5. A semiconductor laser in accordance with claim 1, 2, 3 or 4, wherein said one of said two component layers which is in direct contact with said active layer is disposed between said active layer and a first clad layer which is on the side opposite to said semiconductor substrate with respect to said active layer.

6. A semiconductor laser in accordance with claim 1, 2, 3 or 4, wherein said one of said two component layers which is in contact with said active layer is disposed between a second clad layer formed on said substrate and said active layer.

* * * * *